(12) United States Patent
Chu et al.

(10) Patent No.: US 8,854,778 B2
(45) Date of Patent: Oct. 7, 2014

(54) ESD PROTECTION CIRCUIT

(75) Inventors: Li-Wei Chu, Hsinchu (TW); Chun-Yu Lin, Hualien (TW); Shiang-Yu Tsai, New Taipei (TW); Ming-Dou Ker, Zhubei (TW); Ming-Hsien Tsai, Sindian (TW); Tsun-Lai Hsu, Guansi Township, Hsinchu County (TW); Chew-Pu Jou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 279 days.

(21) Appl. No.: 13/337,463

(22) Filed: Dec. 27, 2011

(65) Prior Publication Data

US 2013/0163127 A1    Jun. 27, 2013

(51) Int. Cl.
*H02H 3/20* (2006.01)

(52) U.S. Cl.
USPC ............ 361/56; 361/111; 361/91.1; 361/91.5

(58) Field of Classification Search
USPC ................... 361/56, 111, 91.1, 91.5
See application file for complete search history.

(56) References Cited

U.S. PATENT DOCUMENTS

| | | | |
|---|---|---|---|
| 3,155,927 A | 11/1964 | True | |
| 5,309,428 A * | 5/1994 | Copley et al. | 370/245 |
| 5,754,381 A * | 5/1998 | Ker | 361/56 |
| 7,005,939 B2 * | 2/2006 | Zerbe et al. | 333/100 |
| 7,192,823 B2 * | 3/2007 | Kao | 438/200 |
| 7,265,433 B2 | 9/2007 | Pillai et al. | |
| 7,894,173 B2 | 2/2011 | Deng et al. | |
| 2006/0151851 A1 | 7/2006 | Pillai et al. | |
| 2011/0279935 A1* | 11/2011 | Iwasa et al. | 361/56 |

OTHER PUBLICATIONS

Linten, D. et al., "A 4.5kV HBM, 300 V CDM, 1.2 kV HMM ESD Protected DC-to-16.1 GHz Wideband LNA in 90 nm CMOS", EOS/ESD Symposium, 2009, 6 pages.
Galal, S. et al., "Broadband ESD Protection Circuits in CMOS Technology", IEEE Journal of Solid-State Circuits, Brief Papers, Dec. 2003, 38(12):2334-2340.

* cited by examiner

*Primary Examiner* — Zeev V Kitov
(74) *Attorney, Agent, or Firm* — Duane Morris LLP (57) ABSTRACT

An electrostatic discharge protection circuit includes an input node coupled to receive an input signal and an output node coupled to output the input signal to an internal circuit. A first inductor is coupled to the input node and to the output node, and a second inductor is coupled to the output node and to a first power supply node through a resistance. A plurality of protection devices are coupled to the first and second inductors and are disposed in parallel with each other.

20 Claims, 11 Drawing Sheets

ESD PROTECTION CIRCUIT

FIELD OF DISCLOSURE

The disclosed systems and methods relate to integrated circuits. More specifically, the disclosed systems and methods relate to integrated circuits with improved electrostatic discharge (ESD) protection circuits.

BACKGROUND

With the continued miniaturization of integrated circuit (IC) devices, the current trend is to produce integrated circuits having shallower junction depths, thinner gate oxides, lightly-doped drain (LDD) structures, shallow trench isolation (STI) structures, and self-aligned silicide (salicide) processes, all of which are used in advanced sub-quarter-micron complementary metal oxide semiconductor (CMOS) technologies. All of these processes cause the related CMOS IC products to become more susceptible to damage due to ESD events. Therefore, ESD protection circuits are built onto the chip to protect the devices and circuits on the IC from ESD damage. ESD protection circuits are typically provided for input/output ("I/O") pads. However, conventional ESD protection circuits cause undesirable signal losses.

DETAILED DESCRIPTION

This description of the exemplary embodiments is intended to be read in connection with the accompanying drawings, which are to be considered part of the entire written description.

The improved electrostatic discharge ("ESD") circuits disclosed herein advantageously protect high-speed circuits (e.g., circuits having data rates of 10 Gb/s and beyond and operating frequencies of greater than one gigahertz) with reduced signal loss.

Figure 1:
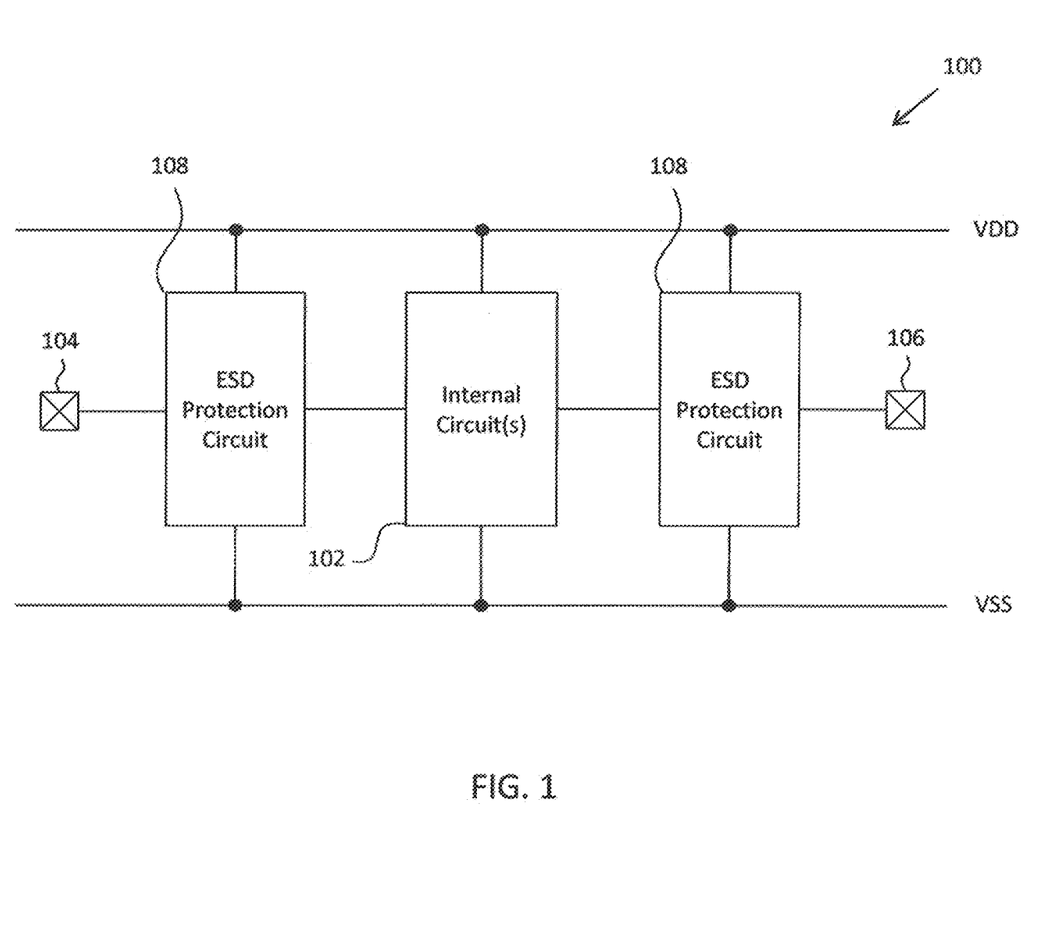
FIG. 1 illustrates a block diagram of an integrated circuit including internal circuitry and ESD protection circuitry.

FIG. 1 illustrates an integrated circuit 100 including an internal circuitry 102 disposed between an input pad 104, and an output pad 106. ESD protection circuitry 108 is disposed between the internal circuit(s) 102 and the input pad 104 as well as between the internal circuit(s) 102 and the output pad 106.

Figure 2:
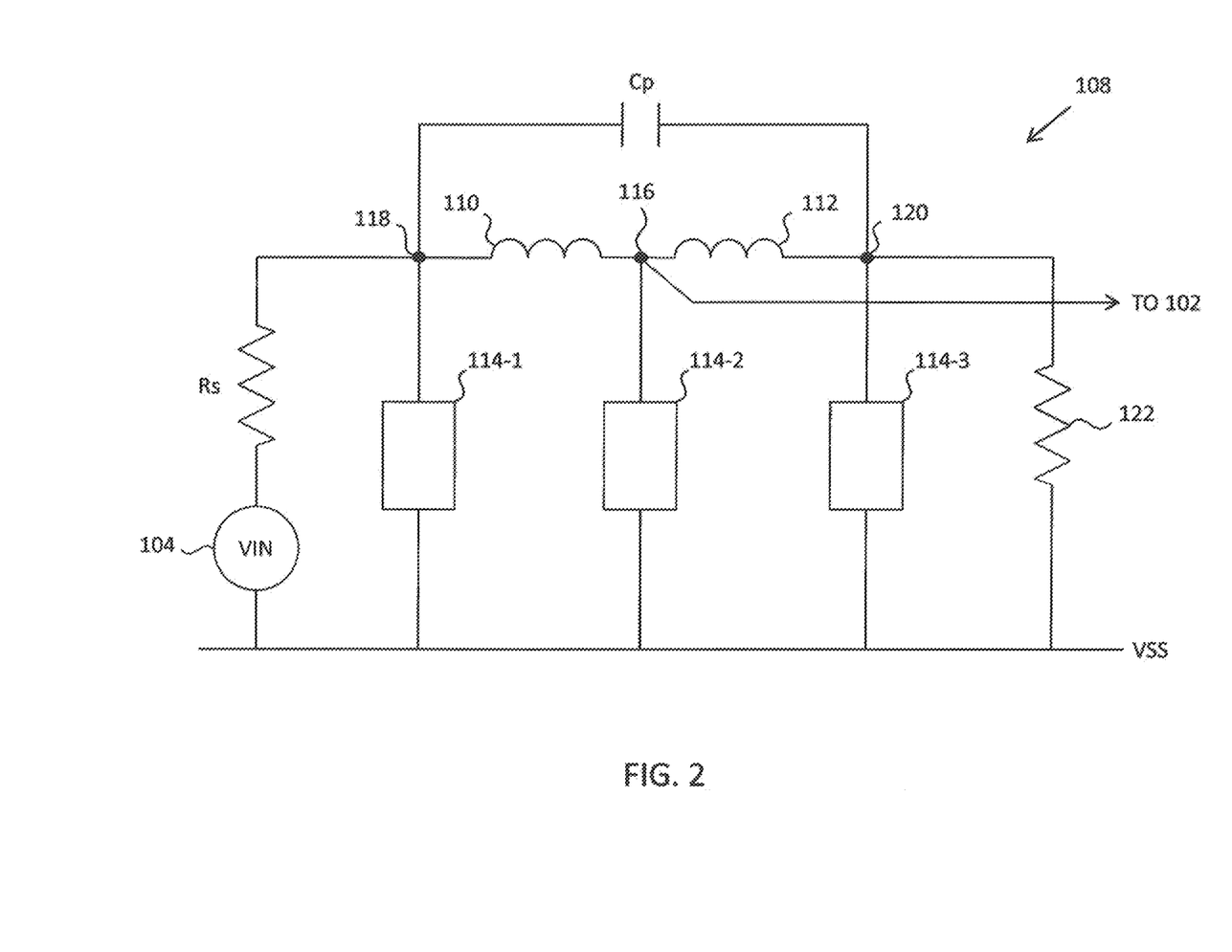
FIG. 2 illustrates one example of an improved ESD protection circuit.

FIG. 2 illustrates one example of the equivalent circuit of an improved ESD protection circuit 108. As shown in FIG. 2, ESD protection circuit 108 includes a pair of inductors 110, 112 and a plurality of distributed protection devices 114-1, 114-2, and 114-3 ("protection devices 114") coupled to inductors 110, 112 and disposed in parallel with one another and with a resistance 122. In particular, inductor 110 is coupled to inductor 112 at node 116, which is also coupled to protective device 114-2 and serves as the output node of protection circuit 108. Inductor 110 is also coupled to receive input voltage, VIN, from voltage source node 104 through a resistance, Rs, which may be the poly or substrate resistance as described in more detail below. Protection device 114-1 is coupled to node 118, which is also coupled to inductor 110. Inductor 112 is coupled to node 120, which is coupled to protection device 114-3 and to a resistor 122. A parasitic capacitance Cp is coupled to nodes 118 and 120 in parallel with inductors 110 and 112. Although three distributed protection devices 114 are shown in FIG. 2, one skilled in the art will understand that fewer or more protection devices 114 may be implemented.

Protection devices 114 may be implemented as a variety of devices having different capacitances. For example, protection devices 114 may be implemented as a diode, a n-type metal oxide semiconductor (NMOS) transistor having its gate grounded (GGNMOS), or as a silicon-controlled rectifier (SCR), to name a few examples. In some embodiments, protection devices 114 are implemented such that the protection device directly coupled to output node 116, e.g., protection device 114, has a greater capacitance than the other protection devices, e.g., protection devices 114-1 and 114-3. One skilled in the art will understand that other designs may be implemented such that each of the protection devices 114 are of equal capacitance or other protection devices 114 have greater capacitances than the protection device directly coupled to output node 116.

Figure 3A:
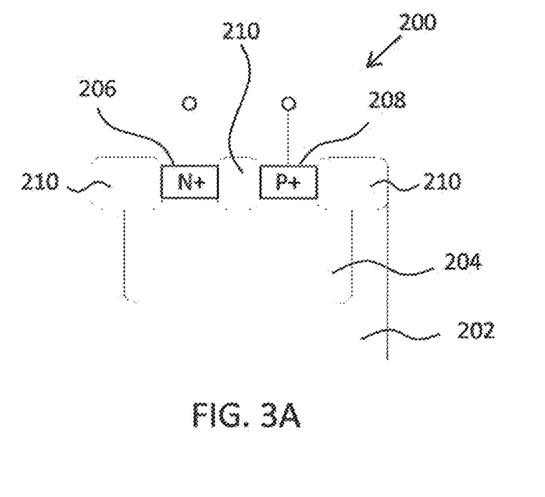
FIG. 3A-3C illustrate embodiments of protection devices in accordance with the ESD protection circuit illustrated in FIG. 2.

FIG. 3A is a cross-sectional view of one example of a diode 200 that may be implemented as a protection device 114. As shown in FIG. 3A, diode 200 may include a p-type substrate 202 in which p-well 204 is formed. Although diode 200 is described as being formed in a p-type substrate 202 and a p-well 204, one skilled in the art will understand that diode 200 may be formed in n-type substrates and n-wells.

A doped N+ area 206 and a doped P+ area 208 are formed in an upper surface of p-well 204 and are separated by shallow-trench isolation regions 210 that are formed in the upper area of p-well 204 and p-type substrate 202. N+ area 206 is configured to operate as the cathode of diode 200, and P+ area 208 is configured to operate as the anode of diode 200 such that current flows from P+ area 208 to N+ area 206.

Figure 3B:
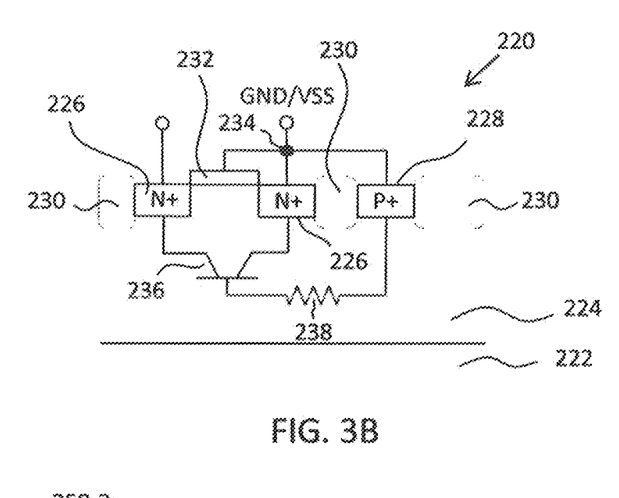

FIG. 3B is a cross-sectional view of an example of a GGNMOS 220 that may be implemented as a protection device 114. As shown in FIG. 3B, GGNMOS 220 includes a p-type substrate 222 in which p-well 224 is formed. Although GGNMOS 220 is described as being formed in a p-type substrate 222 and a p-well 224, one skilled in the art will understand that GGNMOS 220 may be formed in n-type substrates and n-wells.

A pair of N+ regions 226 and a P+ region 228 are formed in an upper surface of p-well 224. The N+ regions 226 are separated from P+ region 228 by STI regions 230. A gate 232 is formed over p-well 224 between N+ region 226. Gate 232 is coupled to one of the N+ areas 226 and to P+ region at node 234, which is coupled to ground, GND. Within well 224, the structure of GGNMOS 220 forms a bipolar junction transistor ("BJT") 236 having its collector and emitter coupled to N+ areas 226 and its base coupled to P+ region 228 through p-well 226 having a resistance represented by resistor 238.

Figure 3C:
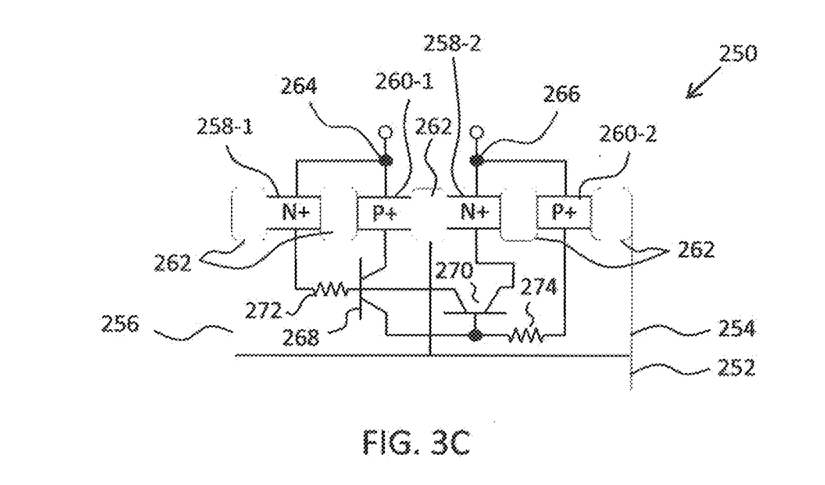

FIG. 3C is a cross-sectional view of an SCR 250 that may be used as a protection device 114. As shown in FIG. 3C, SCR 250 includes a p-type substrate 252 in which a p-well 254 and an n-well 256 are formed. Although SCR 250 is described as being formed in a p-type substrate 252 and a p-well 254, one skilled in the art will understand that SCR 250 may be formed in n-type substrates and n-wells.

N+ area 258-1 and P+ area 260-1 are formed in the upper surface of n-well 256, and N+ area 258-2 and P+ area 260-2 are formed in the upper surface of p-well 254. STI regions 262 are formed in the upper areas of p-well 254 and n-well 256 and are disposed between adjacent N+ regions 258 and P+ regions 260. N+ region 258-1 and P+ region 260-1 are coupled together at node 264, and N+ region 256-2 and P+ region 258-2 are coupled together at node 266.

A BJT 270 is effectively formed within p-well 254 with N+ areas 258 serving as the collector and emitter contacts of BJT 270 and P+ area 260-2 serving as the base contact of BJT 270. BJT 272 is effectively formed within n-well 256 with P+ areas 260 serving as the collector and emitter contacts and N+ area 258-1 serving as the base contact. The poly or substrate resistances are shown as resistors 272 and 274.

Figure 4A:
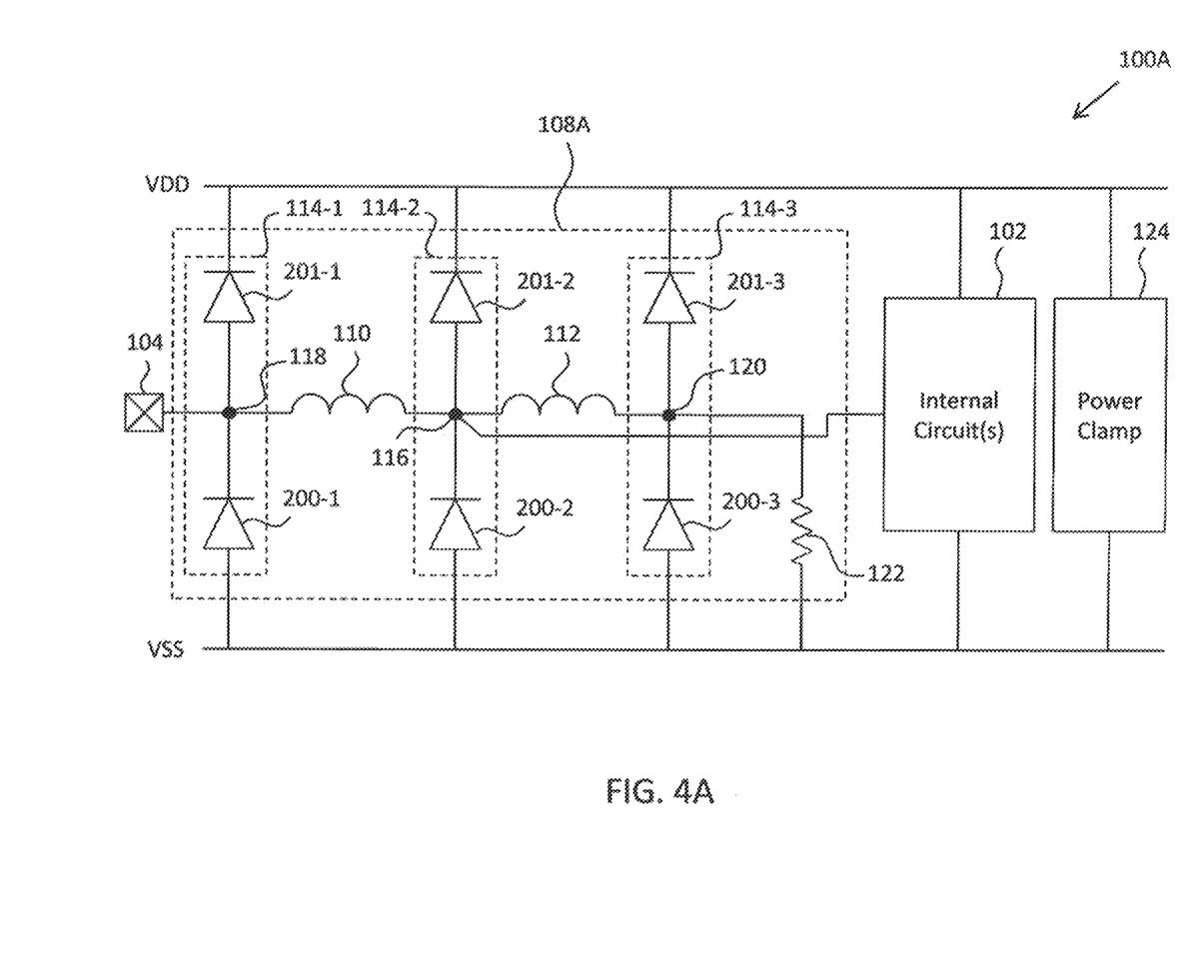
FIG. 4A-4C illustrate embodiments of ESD protection circuits in accordance with the ESD protection circuit illustrated in FIG. 2 and the protection devices illustrated in FIGS. 3A-3C.

FIG. 4A illustrates one example of an integrated circuit 100A that includes ESD protection circuitry 108 in which protection devices 114 include diodes 200 as shown in accordance with FIG. 3A. Integrated circuit 100A includes internal circuit(s) 102 coupled between high and low power supply rails or nodes, which may be respectively set at VDD and VSS. Internal circuit(s) 102 receives an input signal from input terminal 104, which is coupled to internal circuit(s) through ESD protection circuit 108A. An ESD power clamp 124 may be coupled in parallel with internal circuit(s) 102 between the high and low power supply nodes.

ESD protection circuit includes inductors 110 and 112 that are coupled together in series. Inductor 110 is coupled to node 118, which is coupled to input terminal 104 and to diodes 200-1 and 201-1 of protection device 114-1. In particular, the anode of diode 200-1, e.g., P+ region 208, is coupled to VSS, and the cathode of diode 200-1, e.g., N+ region 206, is coupled to node 118. Node 118 is also coupled to the anode of diode 201-1, which has its cathode coupled to VDD. Diode 201-1 may have a cross-sectional area that is similar to the cross-sectional area of diode 200 shown in FIG. 3A except that diode 201 is configured as a p-type diode whereas diode 200 is configured as an n-type diode as will be understood by one skilled in the art.

Inductor 110 is coupled to inductor 112 at node 116, which is also coupled to diodes 200-2, 201-2 of protection device 114-2 and to internal circuit(s) 102. Diode 200-2 has its anode coupled to VSS and its cathode coupled to node 116, and diode 201-2 has its anode coupled to node 116 and its cathode coupled to VDD.

Inductor 112 is also coupled to node 120 to which diodes 200-3 and 201-3 of protection device 114-3 and resistor 122 are coupled. The anode of diode 200-3 is coupled to the low voltage supply set at VSS, and the cathode of diode 200-3 is coupled to node 120. The anode of diode 201-3 is coupled to node 120, and the cathode of diode 201-3 is coupled to the high voltage power supply set at VDD. Resistor 122 is coupled to node 120 and to VSS in parallel with diode 200-3.

Figure 4B:
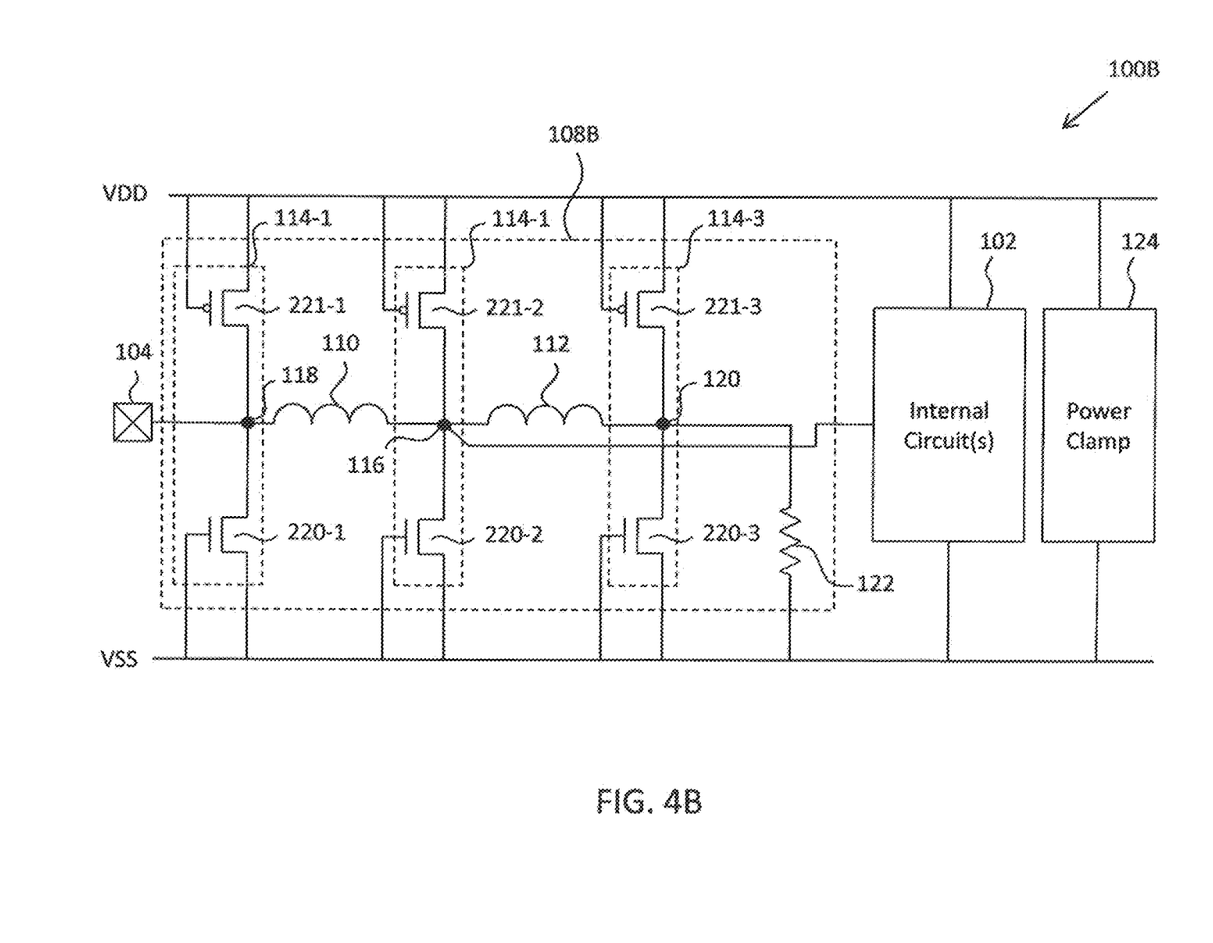

FIG. 4B illustrates one example of an integrated circuit 100B that includes ESD protection circuitry 108 in which protection devices 114 include transistors 220, 221. Integrated circuit 100B includes internal circuit(s) 102 coupled between high and low power supply rails, which may be respectively set at VDD and VSS. Internal circuit(s) 102 receives an input signal from input terminal 104, which is coupled to internal circuit(s) through ESD protection circuit 108B. An ESD power clamp 124 may be coupled in parallel with internal circuit(s) 102 between the high and low power supply nodes.

Transistor 220-1 of protection device 114-1 is an NMOS transistor in accordance with FIG. 3B having its source and gate, e.g., node 234 in FIG. 3B, both coupled to VSS. The drain of transistor 220-1, e.g., N+ region 226, is coupled to node 118, which is coupled to input node 104, transistor 221-1, and node 116. Transistor 221-1 of transistor 114-1 is a PMOS transistor having a similar cross-sectional configuration as transistor 220-1 shown in FIG. 3B except that transistor 221-1 is configured as a PMOS instead of as an NMOS transistor. The drain of transistor 221-1 is coupled to node 118, and the source and gate of transistor 221-1 are coupled to VDD.

Inductors 110 and 112 are coupled together at node 116, which is also coupled to transistors 220-2, 221-2 of protection device 114-2 and to internal circuit(s) 102. Transistor 220-2 has its source and gate coupled to ground or VSS and its drain coupled node 116. The gate and source of transistor 221-2 are both coupled to VDD, and the drain of transistor 221-2 is coupled to node 116. Node 120 is coupled to resistor 122, to the drains of transistors 220-3 and 221-3 of protection device 114-3. The source and gate of transistor 220-3 are coupled to a low voltage supply, such as VSS or ground, and the source and gate of transistor 221-3 are coupled to a high voltage supply, such as to VDD.

Figure 4C:
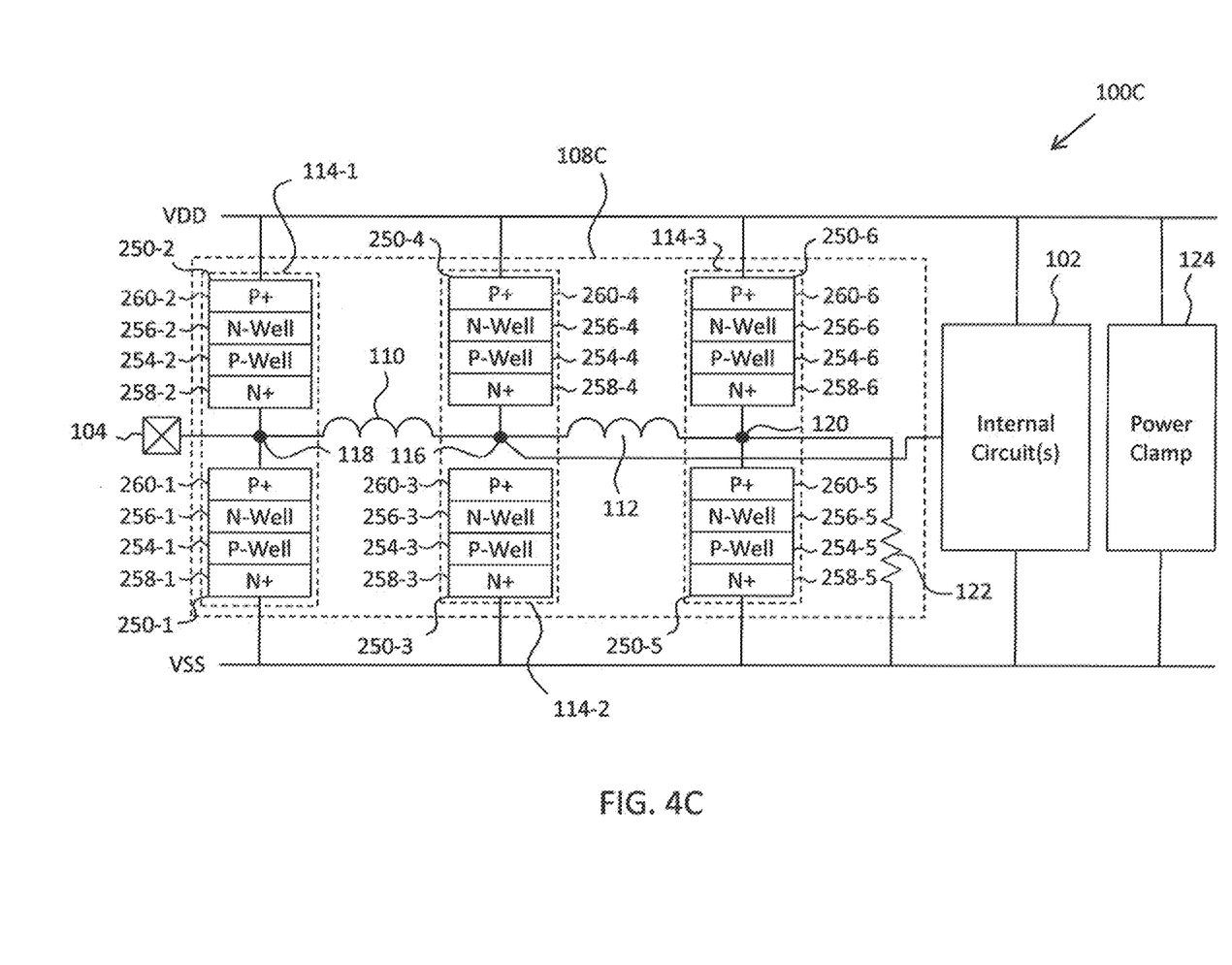

FIG. 4C illustrates one example of an integrated circuit 100C that includes ESD protection circuitry 108 in which protection devices 114 include SCRs 250 in accordance with FIG. 4C. As shown in FIG. 4C, SCRs 250-1 and 250-2 of protection device 114-1 are coupled to node 118 to which input terminal 104 and inductor 110 are coupled. An ESD power clamp 124 may be coupled in parallel with internal circuit(s) 102 between the high and low power supply nodes.

N+ region 258-1 of SCR 250-1 is coupled to VSS and to p-well 254-1, which is also coupled to n-well 256-1. P+ region 260-1 of SCR 250-1 is coupled to n-well 256-1 and to node 118. SCR 250-2 has an N+ region 258-2 coupled to node 118 and to p-well 254-2. P-well 254-2 is coupled to P+ region 260-2 through n-well 256-2. P+ region is coupled between n-well 256-2 and VDD.

Inductor 110 is coupled to inductor 112 at node 116 to which SCR 250-3, SCR 250-4 of protection device 114-2, and internal circuit(s) 102 are coupled. SCR 250-3 is disposed between VSS and node 116 such that N+ region 258-3 is coupled to VSS and to p-well 254-3. N-well 256-3 is coupled such that it is disposed between p-well 254-3 and P+ region 260-3, which is coupled to node 116. SCR 250-4 is configured such that N+ region 116 is directly coupled to node 116 and to p-well 254-4 and P+ region 260-4 is directly coupled to VDD and to n-well 256-4.

Inductor 112, SCRs 250-5 and 250-6 of protection device 114-3, and resistor 122 are coupled together at node 120. Node 120 is coupled to ground through P+ region 260-5, n-well 256-5, p-well 254-5, and N+ region 258-5 of SCR 250-5. N+ region 258-6 of SCR 250-6 is coupled between node 120 and p-well 254-6 of SCR 250-6. N-well 256-6 is disposed between p-well 254-6 and P+ region 260-6, which is coupled to VDD.

Although FIGS. 4A-4C illustrate embodiments in which each ESD protection device 114 is implemented as a same type of protection device, e.g., as diodes 200, transistors 220, or as SCRs 250, one skilled in the art will understand that ESD protection circuit 108 may include different types of protection devices 114, e.g., as diodes 200, transistors 220, and/or SCRs 250. The operation of the integrated circuit 100 including improved ESD protection circuit 108 is described with reference to FIG. 5, which is a flow diagram of one example of a method 500 of providing ESD protection.

Figure 5:
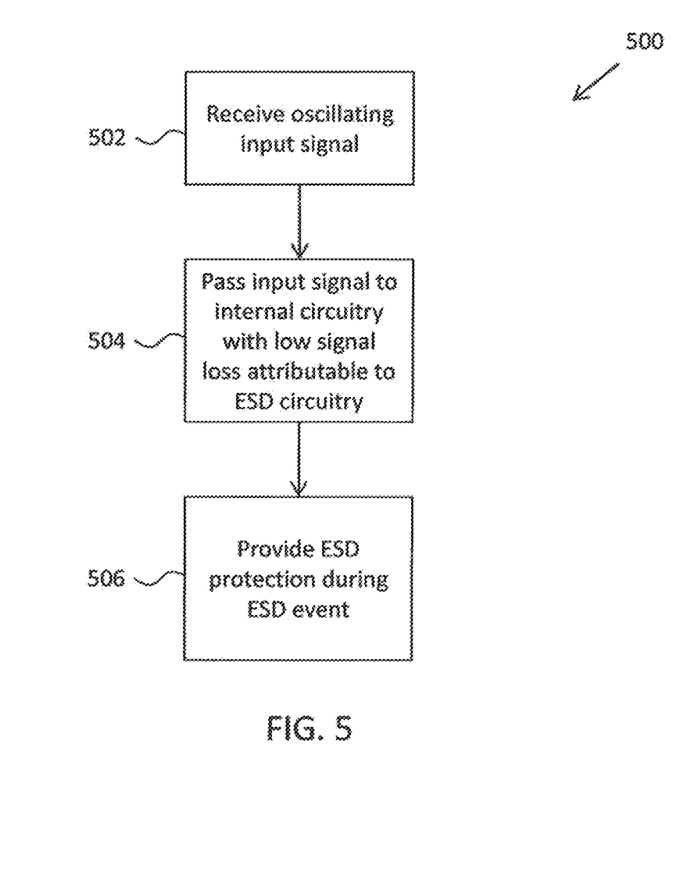
FIG. 5 is a flow diagram of one example of a method of providing ESD protection.

At block 502, an oscillating or periodic input signal (e.g., a radio frequency "RF" signal) is received at input node 104. During normal high-frequency operation (e.g., frequencies at or above 1 GHz) at block 504, the oscillating input signal is passed to internal circuit(s) 102 with reduced signal loss attributable to ESD protection circuitry.

At block 506, ESD protection circuitry provides a pathway for ESD current to flow to ground away from internal circuit(s) 102. As will be understood by one skilled in the art, the high current generated in response to an ESD event between power rails VDD and VSS is channeled away from internal circuit(s) by ESD protection devices 114.

The improved signal loss characteristics provided by ESD protection circuit 108 is apparent in the various eye diagrams shown in FIGS. 6A-6D and 7A-7D. The eye diagram shown in FIG. 6A was obtained in response to a data rate of 40 Gb/s second being received at node 116 with the capacitance across ESD protection device 114-1, $C_{114-1}$, being 50 fF, the capacitance across ESD protection device or internal circuit 114-2, $C_{114-2}$, being 300 fF, and the capacitance across ESD protection device 114-3, $C_{114-3}$, being 50 fF such that the total capacitance, $C_{total}$, is 400 fF. Accordingly, the capacitance of protection device 114-2 directly coupled to output node 116 is greater than a capacitance of protection device 114-1 and protection device 114-3, which are respectively coupled to output node 116 through inductors 110 and 112. The eye of FIG. 6A has a width of 24 ps and a height of 0.35 V.

Figure 6A:
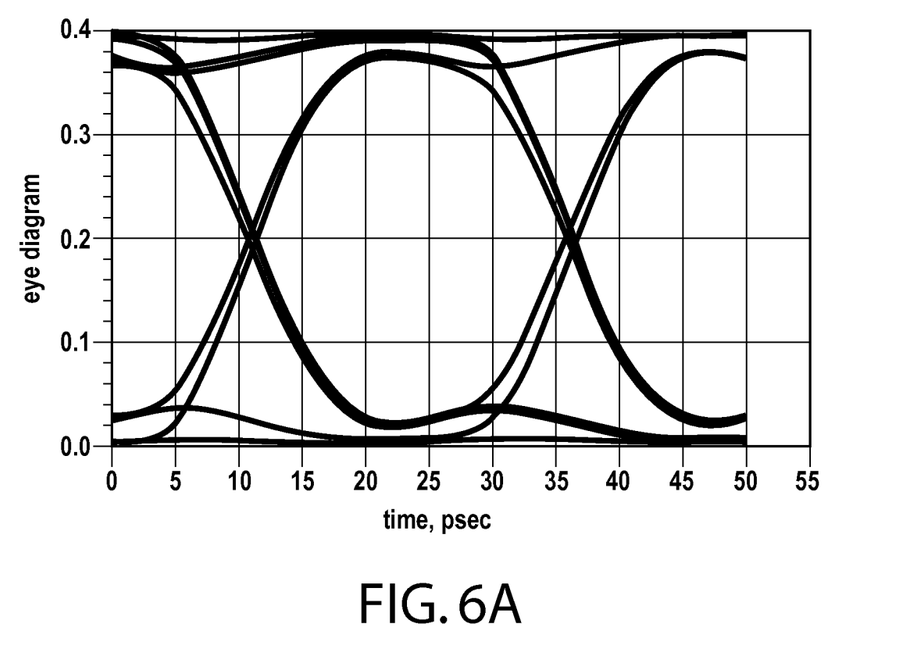
FIGS. 6A-6D are eye diagrams generated in response to a signal received at a first data rate when ESD protection devices have various capacitances.
Figure 6B:
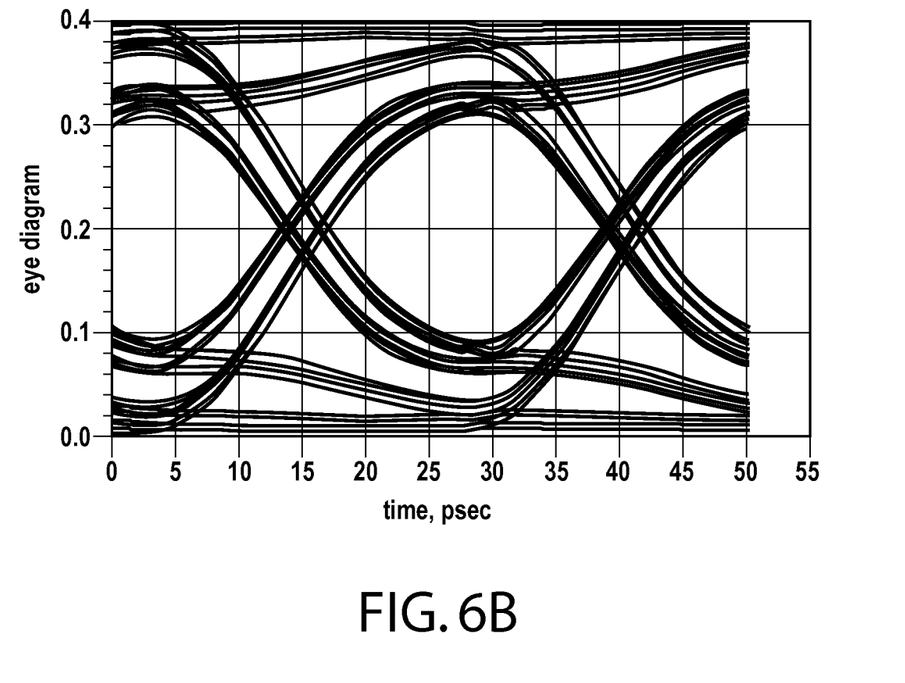

The eye diagram shown in FIG. 6B was obtained using the same data rate as the data rate used to generate the eye diagram in FIG. 6A (i.e., 40 Gb/s) and doubling the capacitance values of protection devices 114. The width of the eye in FIG. 6B is approximately 20.8 ps with a height of approximately 0.21 V with, $C_{114-1}$=100 fF, $C_{114-2}$=600 fF, $C_{114-3}$=100 fF, and $C_{total}$=800 fF.

Figure 6C:
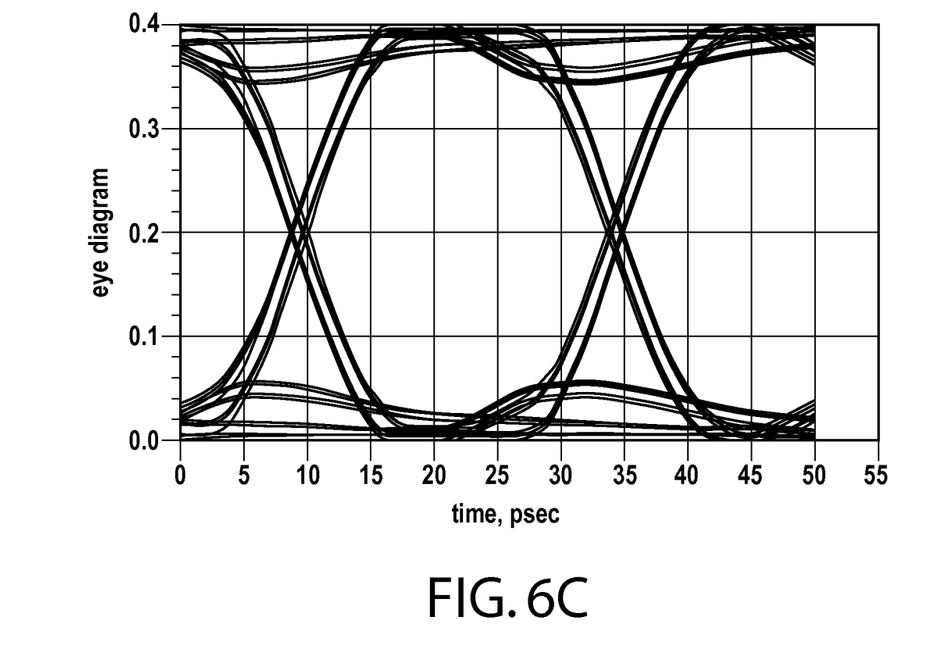
Figure 6D:
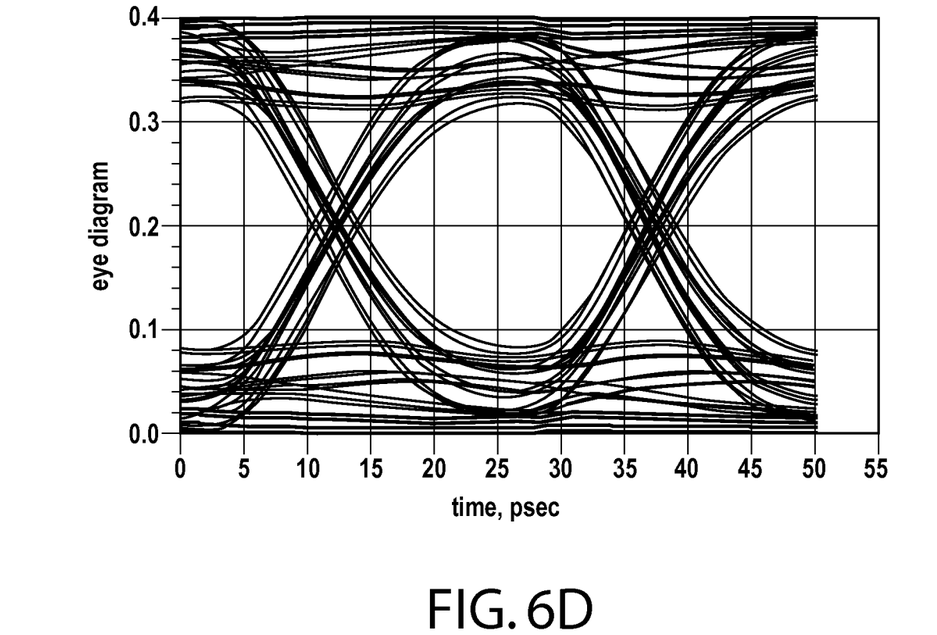

FIGS. 6C and 6D are eye diagrams obtained with the same total capacitances as the capacitances in FIGS. 6A and 6B, respectively, i.e., $C_{total}$=400 fF and $C_{total}$=800 fF, but with different distributions of the capacitances, in response to a signal received with the same data rate (i.e., 40 Gb/s). For example, the eye diagram in FIG. 6C was generated with $C_{total}$=400 fF with $C_{114-1}$=0 fF, $C_{114-2}$=300 fF, and $C_{114-3}$=100 fF, and the eye diagram in FIG. 6D was generated with $C_{total}$=800 fF with $C_{114-1}$=0 fF, $C_{114-2}$=600 fF, and $C_{114-3}$=200 fF. The width of the eye in FIG. 6C is approximately 24 ps with a height of approximately 0.35 V, and the width of the eye in the eye diagram shown in FIG. 6D is approximately 21.3 ps with a height of 0.24 V.

Figure 7A:
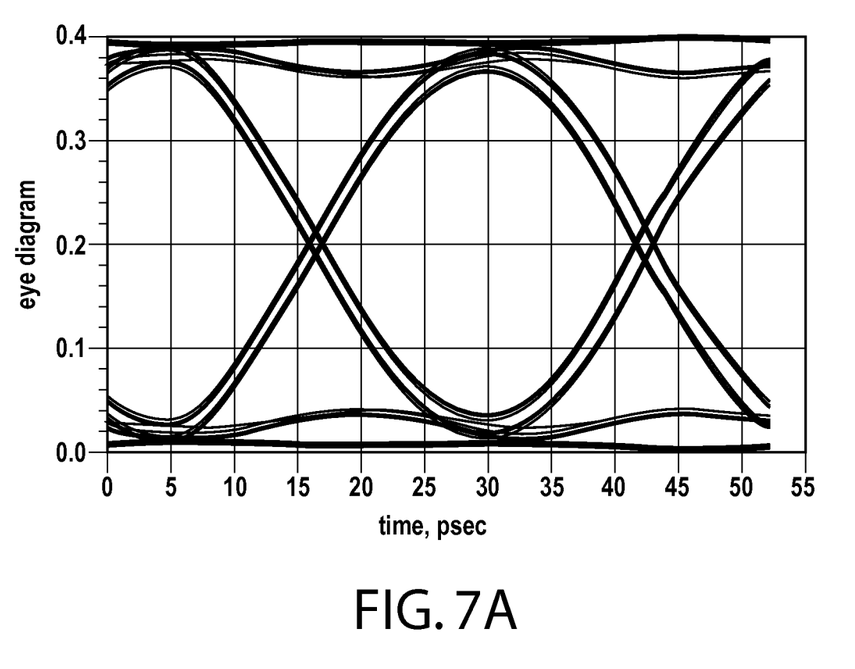
FIGS. 7A-7D are eye diagrams generated in response to a signal received at a second data rate when ESD protection devices have various capacitances.
Figure 7B:
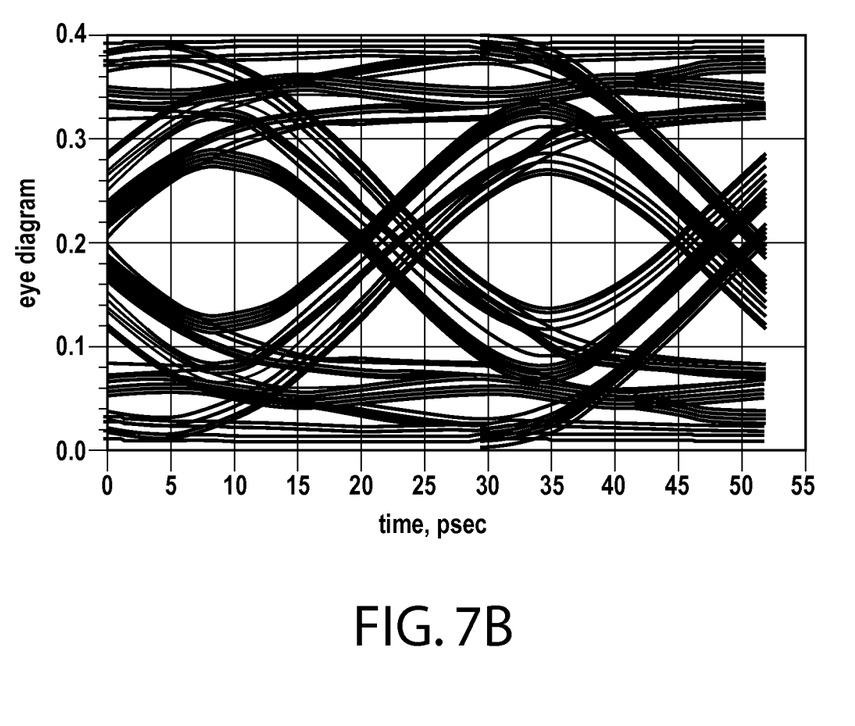

The eye diagrams in FIGS. 7A-7D have the same respective capacitance and capacitance distributions as their counterparts in FIGS. 6A-6D, but are generated at node 116 in response to a data rate of 60 Gb/s. Referring first to FIG. 7A, the eye of the eye diagram has a width of 15.5 ps and a height of 0.33 V with $C_{total}$=400 fF when $C_{114-1}$=50 fF, $C_{114-2}$=300 fF, and $C_{114-3}$=50 fF. When the capacitances of the ESD protection devices 114 are doubled, i.e., $C_{114-1}$=100 fF, $C_{114-2}$=600 fF, and $C_{114-3}$=100 fF, the width of the eye of the eye diagram in FIG. 7B is approximately 12.3 ps and the height of the eye is approximately 0.14 V.

Figure 7C:
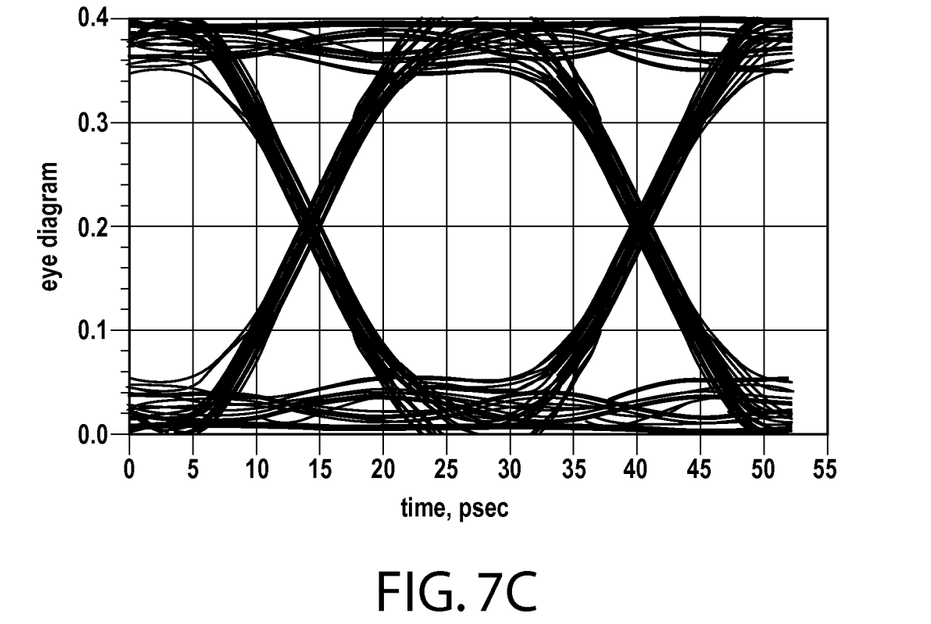
Figure 7D:
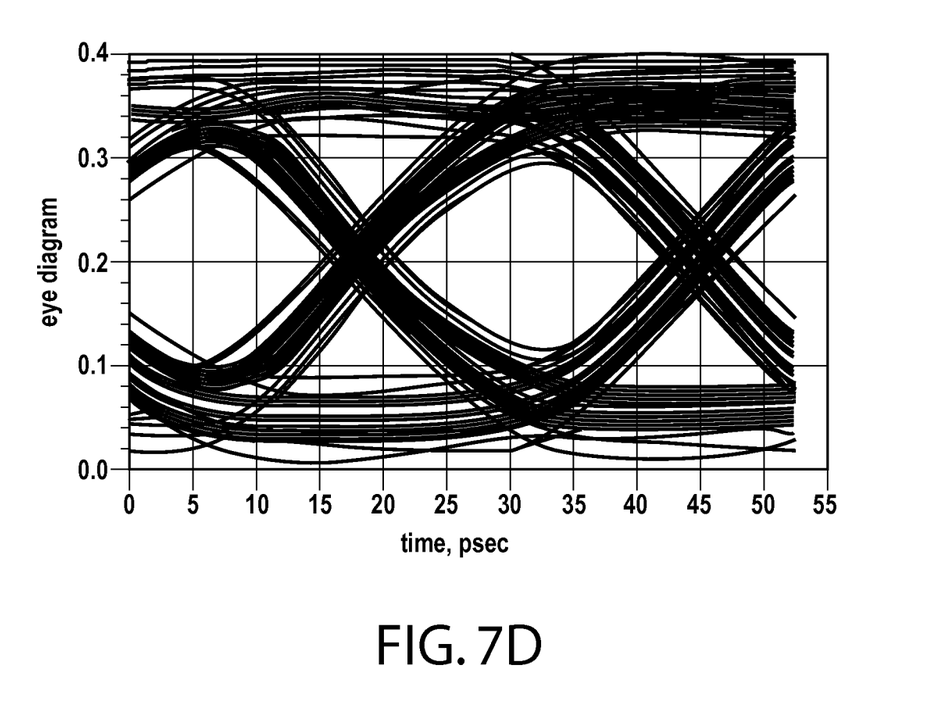

The eye diagram in FIG. 7C, which is generated with $C_{114-1}$=0 fF, $C_{114-2}$=300 fF, and $C_{114-3}$=100 fF, has a width of 15.7 ps and a height of −0.3 V. When the capacitances of ESD protection devices 114 are doubled, i.e., $C_{114-1}$=0 fF, $C_{114-2}$=600 fF, and $C_{114-3}$=200 fF, the width of the eye is approximately 13.2 ps and the height of the eye is approximately 0.2 V.

As described above, the improved ESD circuits advantageously protect high-speed circuits (e.g., circuits having data rates of 10 Gb/s and beyond and operating frequencies of greater than one gigahertz) with reduced signal loss.

In some embodiments, an electrostatic discharge protection circuit includes an input node coupled to receive an input signal and an output node coupled to output the input signal to an internal circuit. A first inductor is coupled to the input node and to the output node, and a second inductor is coupled to the output node and to a first power supply node through a resistance. A plurality of protection devices are coupled to the first and second inductors and are disposed in parallel with each other.

In some embodiments, a method includes receiving an oscillating signal at an input node coupled to an electrostatic discharge protection. The electrostatic discharge protection circuit includes a first inductor coupled to the input node and to an output node, a second inductor coupled to the output node and to a first power supply node through a resistance, and a plurality of protection devices coupled to the first and second inductors and disposed in parallel with each other. The input signal is output to a circuit coupled to the output node. A channel is provided to channel for current away from the circuit during an electrostatic discharge event.

In some embodiments, an integrated circuit includes internal circuitry, an input node for receiving an input signal, and an electrostatic discharge circuit coupled between the internal circuitry and the input node. The electrostatic discharge circuit is configured to channel for current away from the internal circuitry during an electrostatic discharge event and includes a first inductor coupled to the input node and to an output node that is coupled to the internal circuitry, a second inductor coupled to the output node and to a first power supply node through a resistance, and a plurality of protection devices coupled to the first and second inductors and disposed in parallel with each other.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An electrostatic discharge protection circuit comprising:
   an input node of an integrated circuit configured to electrically receive an electrostatic discharge event and to receive an input signal;
   an output node coupled to output the input signal to an internal circuit of the integrated circuit;
   a first inductor coupled to the input node and to the output node;
   a second inductor disposed in series with the first inductor and coupled to the output node and to a first power supply node through a resistance; and
   a plurality of protection devices coupled to the first and second inductors and disposed in parallel with each other,
   wherein the electrostatic discharge protection circuit is configured to protect the internal circuit from the electrostatic discharge event.

2. The electrostatic discharge circuit of claim 1, wherein the plurality of protection devices includes at least one of a diode, a transistor, and a silicon-controlled rectifier.

3. The electrostatic discharge circuit of claim 2, wherein the transistor includes a gate-grounded NMOS transistor.

4. The electrostatic discharge circuit of claim 1, wherein the plurality of protection devices include:
- a first protection device coupled to the input node and to the first power supply node;
- a second protection device coupled to the output node and to the first power supply node; and
- a third protection device coupled to the first power supply node and to a first node to which the second inductor and the resistance are coupled.

5. The electrostatic discharge circuit of claim 4, wherein the first protection device includes:
- a first diode having an anode coupled to the first power supply node and a cathode coupled to the input node, and
- a second diode having an anode coupled to the input node and a cathode coupled to a second power supply line;

the second protection device includes:
- a third diode having an anode coupled to the first power supply node and a cathode coupled to the output node, and
- a fourth diode having an anode coupled to the output node and a cathode coupled to the second power supply node; and the third protection device includes:
- a fifth diode having an anode coupled to the first power supply node and a cathode coupled to the first node, and
- a sixth diode having an anode coupled to the first node and a cathode coupled to the second power supply node.

6. The electrostatic discharge circuit of claim 4, wherein the first protection device includes:
- a first transistor of a first type having a drain coupled to the input node and a source and a gate coupled to the first power supply node, and
- a first transistor of a second type having a drain coupled to the input node and a source and a gate coupled to a second power supply node;

the second protection device includes:
- a second transistor of the first type having a drain coupled to the output node and a source and a gate coupled to the first power supply node, and
- a second transistor of the second type having a drain coupled to the output node and a source and a gate coupled to the second power supply node; and the third protection device includes:
- a third transistor of the first type having a drain coupled to the first node and a source and a gate coupled to the first power supply node, and
- a third transistor of the second type having a drain coupled to the first node and a source and a gate coupled to the second power supply node.

7. The electrostatic discharge circuit of claim 4, wherein the first protection device includes:
- a first silicon-controlled rectifier coupled between the input node and the first power supply node, and
- a second silicon-controlled rectifier coupled between the input node and a second power supply node;

the second protection device includes:
- a third silicon-controlled rectifier coupled between the output node and the first power supply node, and
- a fourth silicon-controlled rectifier coupled between the output node and the second power supply node; and the third protection device includes:
- a fifth silicon-controlled rectifier coupled between the first node and the first power supply node, and
- a sixth silicon-controlled rectifier coupled between the first node and the second power supply node.

8. The electrostatic discharge circuit of claim 4, wherein a capacitance of the second protection device is greater than a capacitance of the first protection device and a capacitance of the third protection device.

9. A method, comprising:
- receiving an oscillating signal at an input node of an integrated circuit configured to electrically receive an electrostatic coupled to an electrostatic discharge protection circuit comprising
  - a first inductor coupled to the input node and to an output node,
  - a second inductor disposed in series with the first inductor and coupled to the output node and to a first power supply node through a resistance, and
  - a plurality of protection devices coupled to the first and second inductors and disposed in parallel with each other;
- outputting the input signal to a circuit coupled to the output node; and
- providing a channel for current away from the circuit during the electrostatic discharge event.

10. The method of claim 9, wherein the plurality of protection devices include:
- a first protection device coupled to the input node and to the first power supply node;
- a second protection device coupled to the output node and to the first power supply node; and
- a third protection device coupled to the first power supply node and to a first node to which the second inductor and the resistance are coupled.

11. The method of claim 10, wherein a capacitance of the second protection device is greater than a capacitance of the first protection device and a capacitance of the third protection device.

12. The method of claim 9 wherein the plurality of protection devices includes at least one of a diode, a transistor, and a silicon-controlled rectifier.

13. An integrated circuit, comprising:
- internal circuitry;
- an input node for receiving an input signal and electrically receiving an electrostatic discharge event; and
- an electrostatic discharge circuit coupled between the internal circuitry and the input node, the electrostatic discharge circuit configured to channel for current away from the internal circuitry during an electrostatic discharge event, the electrostatic discharge circuit comprising:
  - a first inductor coupled to the input node and to an output node that is coupled to the internal circuitry,
  - a second inductor disposed in series with the first inductor and coupled to the output node and to a first power supply node through a resistance; and
  - a plurality of protection devices coupled to the first and second inductors and disposed in parallel with each other.

14. The integrated circuit of claim 13, wherein the plurality of protection devices include:
- a first protection device coupled to the input node and to the first power supply node;
- a second protection device coupled to the output node and to the first power supply node; and a third protection device coupled to the first power supply node and to a first node to which the second inductor and the resistance are coupled.

15. The integrated circuit of claim 14, wherein
the first protection device includes:
  a first diode having an anode coupled to the first power supply node and a cathode coupled to the input node, and
  a second diode having an anode coupled to the input node and a cathode coupled to a second power supply line;
the second protection device includes:
  a third diode having an anode coupled to the first power supply node and a cathode coupled to the output node, and
  a fourth diode having an anode coupled to the output node and a cathode coupled to the second power supply node; and
the third protection device includes:
  a fifth diode having an anode coupled to the first power supply node and a cathode coupled to the first node, and
  a sixth diode having an anode coupled to the first node and a cathode coupled to the second power supply node.

16. The integrated circuit of claim 14, wherein
the first protection device includes:
  a first transistor of a first type having a drain coupled to the input node and a source and a gate coupled to the first power supply node, and
  a first transistor of a second type having a drain coupled to the input node and a source and a gate coupled to a second power supply node;
the second protection device includes:
  a second transistor of the first type having a drain coupled to the output node and a source and a gate coupled to the first power supply node, and
  a second transistor of the second type having a drain coupled to the output node and a source and a gate coupled to the second power supply node; and
the third protection device includes:
  a third transistor of the first type having a drain coupled to the first node and a source and a gate coupled to the first power supply node, and
  a third transistor of the second type having a drain coupled to the first node and a source and a gate coupled to the second power supply node.

17. The integrated circuit of claim 14, wherein
the first protection device includes:
  a first silicon-controlled rectifier coupled between the input node and the first power supply node, and
  a second silicon-controlled rectifier coupled between the input node and a second power supply node;
the second protection device includes:
  a third silicon-controlled rectifier coupled between the output node and the first power supply node, and
  a fourth silicon-controlled rectifier coupled between the output node and the second power supply node; and
the third protection device includes:
  a fifth silicon-controlled rectifier coupled between the first node and the first power supply node, and
  a sixth silicon-controlled rectifier coupled between the first node and the second power supply node.

18. The integrated circuit of claim 14, wherein a capacitance of the second protection device is greater than a capacitance of the first protection device and a capacitance of the third protection device.

19. The integrated circuit of claim 13, wherein the plurality of protection devices includes at least one of a diode, a transistor, and a silicon-controlled rectifier.

20. The integrated circuit of claim 19, wherein the transistor includes a gate-grounded NMOS transistor.

* * * * *

UNITED STATES PATENT AND TRADEMARK OFFICE
CERTIFICATE OF CORRECTION

PATENT NO. : 8,854,778 B2  Page 1 of 1
APPLICATION NO. : 13/337463
DATED : October 7, 2014
INVENTOR(S) : Li-Wei Chu et al.

It is certified that error appears in the above-identified patent and that said Letters Patent is hereby corrected as shown below:

In the Claims:

Claim 9, Column 8, Lines 11-12 – after "receive an electrostatic" insert -- discharge event, the input node --.

Signed and Sealed this
Fourth Day of August, 2015

Michelle K. Lee
*Director of the United States Patent and Trademark Office*